United States Patent
Ko (10) Patent No.: US 9,576,627 B2
(45) Date of Patent: Feb. 21, 2017

(54) SEMICONDUCTOR DEVICE, SEMICONDUCTOR SYSTEM, AND METHOD FOR USE IN OPERATING THE SAME BASED ON OPERATION MODE INFORMATION

(71) Applicant: SK hynix Inc., Icheon-si, Gyeonggi-do (KR)

(72) Inventor: Bok Rim Ko, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/885,702

(22) Filed: Oct. 16, 2015

(65) Prior Publication Data

US 2016/0372171 A1    Dec. 22, 2016

(30) Foreign Application Priority Data

Jun. 16, 2015 (KR) .................. 10-2015-0085161

(51) Int. Cl.
*G11C 7/22* (2006.01)
*G11C 7/10* (2006.01)
*G11C 7/20* (2006.01)
*G11C 7/14* (2006.01)

(52) U.S. Cl.
CPC ............ *G11C 7/22* (2013.01); *G11C 7/109* (2013.01); *G11C 7/1063* (2013.01); *G11C 7/14* (2013.01); *G11C 7/20* (2013.01)

(58) Field of Classification Search
CPC ....................................................... G11C 7/22
USPC ............................... 365/189.05, 189.17, 201
See application file for complete search history.

(56) References Cited

U.S. PATENT DOCUMENTS

| | | | | |
|---|---|---|---|---|
| 3,878,375 A | * | 4/1975 | Mickowski | B22D 17/32 356/28 |
| 5,903,513 A | * | 5/1999 | Itou | G05F 3/242 365/189.11 |
| 2005/0110580 A1 | * | 5/2005 | Lee | H03L 7/093 331/17 |
| 2006/0149490 A1 | * | 7/2006 | Nam | G11C 29/028 702/107 |
| 2010/0046295 A1 | | 2/2010 | Nobunaga | |

FOREIGN PATENT DOCUMENTS

KR    1020010003914 A    1/2001

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor device includes a flag signal generating circuit, a reference voltage generating circuit, and a first buffer. The flag signal generating circuit generates a flag signal based on an internal command and a training control code which are extracted from an external signal. The reference voltage generating circuit receives a set code based on the flag signal, an input control code and an output control code, and generates a reference voltage whose level is set based on the set code. The first buffer buffers the external signal based on the reference voltage to generate an internal signal, and generates a calibration code from the internal signal based on the flag signal to output the calibration code.

30 Claims, 9 Drawing Sheets

| WR_CD | OP_CD | WR<1> | OP<1> | WR<2> | OP<2> |
|-------|-------|-------|-------|-------|-------|
| L | L | H | L | L | L |
| L | H | L | H | L | L |
| H | L | L | L | H | L |
| H | H | L | L | L | H |

SEMICONDUCTOR DEVICE, SEMICONDUCTOR SYSTEM, AND METHOD FOR USE IN OPERATING THE SAME BASED ON OPERATION MODE INFORMATION

CROSS-REFERENCE TO RELATED APPLICATIONS

The present application claims priority under 35 U.S.C 119(a) to Korean Patent Application No. 10-2015-0085161, filed on Jun. 16, 2015, in the Korean Intellectual Property Office, which is incorporated herein by reference in its entirety as set forth in full.

BACKGROUND

1. Technical Field

Embodiments of the present disclosure relate to semiconductor devices operating using operation mode information and semiconductor systems including the same.

2. Related Art

A semiconductor device may perform various operations such as a read operation and a write operation using operation mode information. The semiconductor device may store the operation mode information in a plurality of storage circuits, which may be realized by mode registers or the like, using a mode register setting operation. The information stored in the storage circuits is subsequently used for operation. The semiconductor device may be included in a semiconductor system to operate in synchronization with an external clock signal outputted from a controller.

Accordingly, what are needed are semiconductor devices which may be utilized in and compatible with different types of semiconductor systems, semiconductor systems which employ such semiconductor devices, and methods for use in operating the same.

SUMMARY

Various embodiments are directed to semiconductor devices, semiconductor systems including such semiconductor devices, and methods of operating such devices and systems.

According to an embodiment, a semiconductor device includes a flag signal generating circuit, a reference voltage generating circuit, and a first buffer. The flag signal generating circuit generates a flag signal based on an internal command and a training control code which are extracted from an external signal. The reference voltage generating circuit receives a set code based on the flag signal, an input control code and an output control code, and generates a reference voltage whose level is set based on the set code. The first buffer buffers the external signal based on the reference voltage to generate an internal signal, and generates a calibration code from the internal signal based on the flag signal to output the calibration code.

According to an embodiment, a semiconductor device includes an input/output control signal generating circuit, a first storage and a second storage. The input/output control signal generating circuit generates a first input control signal, a second input control signal, a first output control signal and a second output control signal based on an input control code and an output control code, while a flag signal is enabled. The first storage stores first information included in a set code for setting a reference voltage at a first set frequency of an external clock signal based on the first input control signal and the first output control signal, and outputs the stored first information as a first storage signal for setting operation mode information. The second storage stores second information included in the set code for setting the reference voltage at a second set frequency of the external clock signal based on the second input control signal and the second output control signal, and outputs the stored second information as a second storage signal for setting the operation mode information.

According to an embodiment, a semiconductor system includes a controller and a semiconductor device. The controller outputs an external signal and a first data signal, and receives a second data signal. The semiconductor device generates a flag signal based on the external signal, receives the first data signal as a set code based on the flag signal, an input control code and an output control code for setting a level of a reference voltage for each frequency of an external clock signal, to buffer the external signal based on the reference voltage for generating an internal signal, and to generate a calibration code from the internal signal based on the flag signal to output the calibration code as the second data signal.

A method for use in operating a semiconductor device or system may be employed. First information included in a set code is received and stored. The reference voltage is set to a first level for a first frequency of an external clock signal based on the stored first information. Second information included in the set code may be received and stored. The reference voltage may be set to a second level for a second frequency of the external clock signal based on the stored second information.

Further, an external signal may be buffered based on the first level or the second level of the reference voltage for generating an internal signal. A calibration code may be generated based on the internal signal, and the calibration code may be outputted.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only, and are not intended to limit the scope of the present disclosure.

Figure 1:
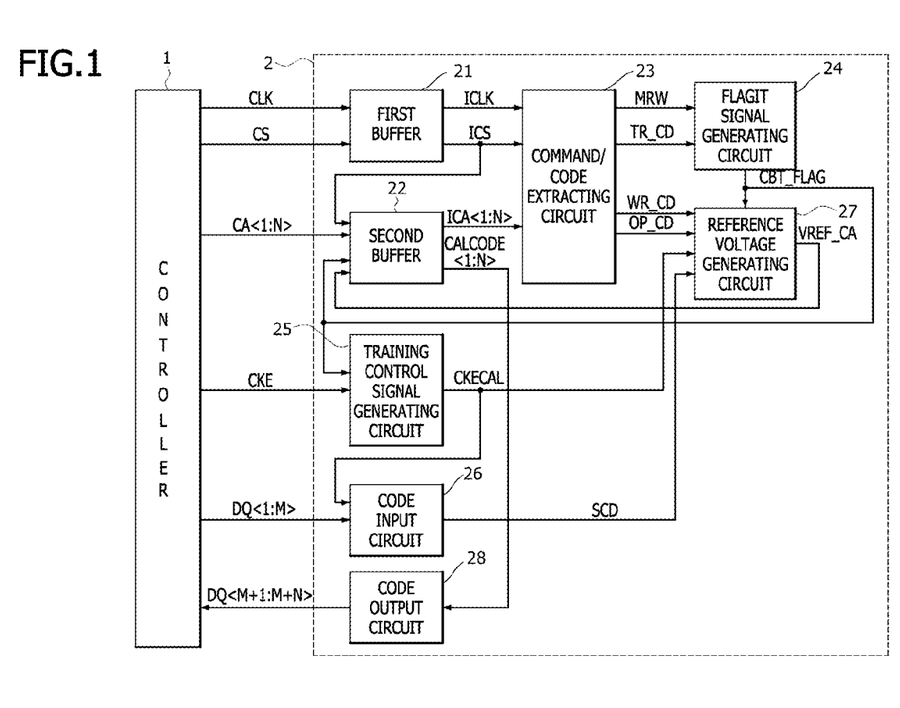
FIG. 1 is a block diagram illustrating a representation of an example of a semiconductor system according to an embodiment.

As illustrated in FIG. 1, a semiconductor system according to an embodiment may include a controller 1 and a semiconductor device 2. The semiconductor device 2 may include a first buffer 21, a second buffer 22, a command/code extracting circuit 23, a flag signal generating circuit 24, a training control signal generating circuit 25, a code input circuit 26, a reference voltage generating circuit 27, and a code output circuit 28.

The controller 1 may transmit an external clock signal CLK, a chip selection signal CS, external signals CA<1:N>, a clock enablement signal CKE and first data signals DQ<1:M> to the semiconductor device 2 and may receive second data signals DQ<M+1:M+N>. The chip selection signal CS may be enabled if a chip including the semiconductor device 2 is selected. The external signals CA<1:N> may include at least one of a command and an address. The command and the address included in the external signals CA<1:N> may be transmitted through the same line or different lines. In an embodiment, the chip selection signal CS and the clock enablement signal CKE which are applied to the semiconductor device 2 may be replaced with other commands, control signals, or the like.

The first buffer 21 may receive and buffer the external clock signal CLK and the chip selection signal CS to generate an internal clock signal ICLK and an internal chip selection signal ICS. The second buffer 22 may buffer the external signals CA<1:N> based on a reference voltage VREF_CA to generate internal signals ICA<1:N>, and may generate calibration codes CALCODE<1:N> from the internal signals ICA<1:N> based on a flag signal CBT_FLAG. A detailed configuration and a detailed operation of the second buffer 22 will be described later with reference to FIG. 2 and FIG. 3.

The command/code extracting circuit 23 may extract an input control code WR_CD, an output control code OP_CD, an internal command MRW and a training control code TR_CD from the internal signals ICA<1:N> in synchronization with the internal clock signal ICLK while the internal chip selection signal ICS is enabled.

A set code SCD for setting a level of the reference voltage VREF_CA according to a frequency of the external clock signal CLK may be stored in a first storage (e.g. first storage 42 of FIG. 5) or a second storage (e.g. second storage 43 of FIG. 5) according to a logic level of the input control code WR_CD. For example, the input control code WR_CD may have a logic "low" level to store first information included in the set code SCD in the first storage 42 of FIG. 5 at a first set frequency of the external clock signal CLK, and may have a logic "high" level to store second information included in the set code SCD in the second storage 43 of FIG. 5 at a second set frequency of the external clock signal CLK. The logic level of the input control code WR_CD may be set to be any suitable level depending on the embodiment.

Figure 5:
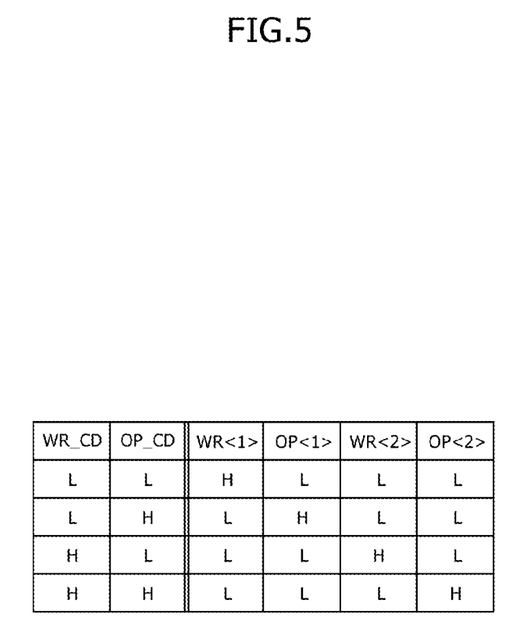
FIG. 5 is a table illustrating an example of operation of the reference voltage generating circuit shown in FIG. 4.

The set code SCD stored in the first storage 42 of FIG. 5 or the set code SCD stored in the second storage 43 of FIG. 5 may be outputted according to a logic level of the output control code OP_CD to set the level of the reference voltage VREF_CA according to the frequency of the external clock signal CLK. For example, the output control code OP_CD may have a logic low level to output the first information which is stored in the first storage 42 of FIG. 5, and may have a logic high level to output the second information which is stored in the second storage 43 of FIG. 5. A logic level of the output control code OP_CD may be set to be any suitable level depending on the embodiment. The internal command MRW may be enabled to store the training control code TR_CD in the flag signal generating circuit 24 and to generate the flag signal CBT_FLAG. A logic level of the enabled internal command MRW may be set to be any suitable level depending on the embodiment.

The training control code TR_CD may include information on an execution/non-execution of a training operation. For example, the training operation may be performed if the training control code TR_CD has a logic high level, and the training operation may not be performed if the training control code TR_CD has a logic low level. A logic level of the training control code TR_CD may be any suitable level and the number of bits of the training control code TR_CD may be set to be any suitable number depending on the embodiment.

A method of including the internal command MRW and the training control code TR_CD in the internal signals ICA<1:N> may vary and will depend on the embodiment. In addition, a method that the command/code extracting circuit 23 extracts the internal command MRW and the training control code TR_CD from the internal signals ICA<1:N> may vary and depend on the embodiment. For example, the command/code extracting circuit 23 may be configured to extract the internal command MRW and the training control code TR_CD from the internal signals ICA<1:N> independent from the internal chip selection signal ICS and the internal clock signal ICLK.

The flag signal generating circuit 24 may store the training control code TR_CD based on the internal command MRW. The flag signal generating circuit 24 may generate the flag signal CBT_FLAG from the stored training control code TR_CD to output the flag signal CBT_FLAG. The flag signal generating circuit 24 may include a mode register to store the training control code TR_CD based on the internal command MRW. The flag signal generating circuit 24 may store the training control code TR_CD therein if the internal command MRW is enabled, and may generate and output the flag signal CBT_FLAG according to the logic level of the training control code TR_CD.

For example, the flag signal CBT_FLAG having a logic high level for execution of the training operation may be generated if the training control code TR_CD has a logic high level. The enabled flag signal CBT_FLAG may be a logic low level, or other suitable level depending on the embodiment.

The training control signal generating circuit 25 may generate a training control signal CKECAL based on the flag signal CBT_FLAG and the clock enablement signal CKE. In an embodiment, the training control signal generating circuit 25 may generate the training control signal CKECAL with a logic high level, in synchronization with a point of time that the flag signal CBT_FLAG is enabled and the clock enablement signal CKE has a logic low level. Logic levels of the flag signal CBT_FLAG, the clock enablement signal CKE and the training control signal CKECAL may be set to be any suitable signal depending on the embodiment.

The code input circuit 26 may receive the first data signals DQ<1:M> as the set code SCD based on the training control signal CKECAL. In an embodiment, the code input circuit 26 may output the first data signals DQ<1:M> as the set code SCD while the training control signal CKECAL is enabled to have a logic high level. The first data signals DQ<1:M> may be transmitted through a data line (not illustrated) between the controller 1 and the semiconductor device 2. The number of bits of the first data signals DQ<1:M> and the number of bits of the set code SCD may be set to be any suitable number of bits.

The set code SCD may include various operation mode information which is used in the semiconductor device 2 according to frequencies of the external clock signal CLK. The operation mode information may include one or more different types of information, such as information on the level of the reference voltage VREF_CA, information on a burst type, information on a burst length, information on a write latency, information on a read latency, information on a preamble, information on a postamble, information on driver strength, information on data bus inversion (DBI), information on on-die termination (ODT) and the like.

The reference voltage generating circuit 27 may generate the reference voltage VREF_CA to transmit the reference voltage VREF_CA to the second buffer 22. The reference voltage generating circuit 27 may adjust the level of the reference voltage VREF_CA which is supplied to the second buffer 22 according to the set code SCD, while the flag signal CBT_FLAG and the training control signal CKECAL are enabled. The reference voltage generating circuit 27 may adjust the level of the reference voltage VREF_CA according to the input control code WR_CD and the output control code OP_CD, for each frequency of the external clock signal CLK. A logic level combination of the set code SCD may be set to be any suitable level or signals depending on the embodiment. A detailed configuration and a detailed operation of the reference voltage generating circuit 27 will be described later with reference to FIG. 4 and FIG. 5.

The code output circuit 28 may receive the calibration codes CALCODE<1:N> from the second buffer 22 to output the calibration codes CALCODE<1:N> as the second data signals DQ<M+1:M+N>. The second data signals DQ<M+1:M+N> are transmitted through a data line (not illustrated) between the controller 1 and the semiconductor device 2.

Figure 2:
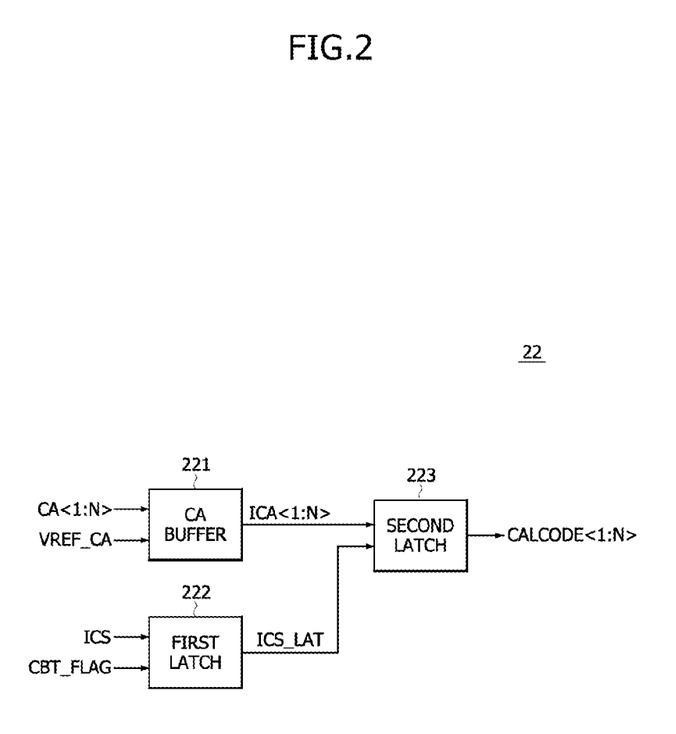
FIG. 2 is a block diagram illustrating a representation of an example of a second buffer included in the semiconductor system of FIG. 1.

Referring to FIG. 2, the second buffer 22 may include a CA buffer 221, a first latch 222, and a second latch 223. The CA buffer 221 may buffer the external signals CA<1:N> based on the reference voltage VREF_CA to generate the internal signals ICA<1:N>. In an embodiment, the CA buffer 221 may drive or set the internal signals ICA<1:N> to a logic high level if levels of the external signal CA<1:N> are higher than a level of the reference voltage VREF_CA and may drive or set the internal signals ICA<1:N> to a logic low level if levels of the external signal CA<1:N> are lower than the level of the reference voltage VREF_CA. The first latch 222 may latch the internal chip selection signal ICS based on the flag signal CBT_FLAG and may output the latched internal chip selection signal ICS as an internal latch signal ICS_LAT. The first latch 222 may generate the internal latch signal ICS_LAT, which is enabled, if both of the flag signal CBT_FLAG and the internal chip selection signal ICS are enabled. The logic levels of the enabled flag signal CBT_FLAG, the enabled internal chip selection signal ICS, and the enabled internal latch signal ICS_LAT may be set to be any suitable level or signals depending on the embodiment. The second latch 223 may latch the internal signals ICA<1:N> if the internal latch signal ICS_LAT is enabled and may output the latched internal signals ICA<1:N> as the calibration codes CALCODE<1:N>.

Figure 3:
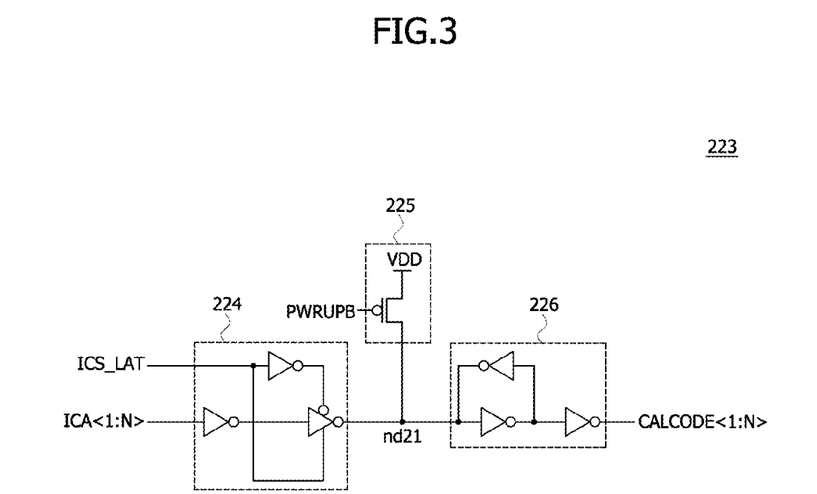
FIG. 3 is a circuit diagram illustrating a representation of an example of a second latch included in the second buffer of FIG. 2.

Referring to FIG. 3, the second latch 223 may include a transmitter 224, an initialization circuit 225 and an output circuit 226. The transmitter 224 may transmit the internal signals ICA<1:N> to an output node nd21 based on the internal latch signal ICS_LAT. In an embodiment, the transmitter 224 may buffer the internal signals ICA<1:N> to output the buffered internal signals ICA<1:N> to the output node nd21 if the internal latch signal ICS_LAT is enabled to have a logic high level.

The initialization circuit 225 may initialize the output node nd21 based on a power-up signal PWRUPB. The power-up signal PWRUPB may have a logic low level during a time period before a level of a power supply voltage VDD reaches a predetermined level (that is, during a power-up period), and a level of the power-up signal PWRUPB may be changed from a logic low level to a logic high level after the power-up period ends. The initialization circuit 225 may drive the output node nd21 to the power supply voltage VDD during the power-up period to initialize the output node nd21. The output circuit 226 may latch the signal of the output node nd21 and may buffer the latched signal to output the buffered signal as the calibration codes CALCODE<1:N>.

Figure 4:
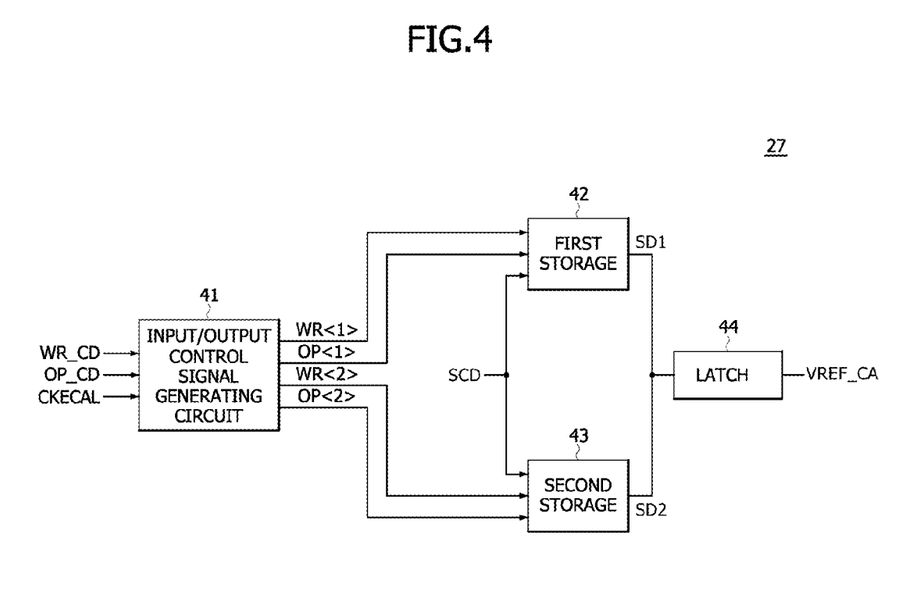
FIG. 4 is a block diagram illustrating a representation of an example of a reference voltage generating circuit included in the semiconductor system of FIG. 1.

Referring to FIG. 4, the reference voltage generating circuit 27 may include an input/output control signal generating circuit 41, a first storage 42, a second storage 43 and a latch 44. The input/output control signal generating circuit 41 may generate first and second input control signals WR<1:2> and first and second output control signals OP<1:2> from the input control code WR_CD and the output control code OP_CD respectively, based on the training control signal CKECAL.

In an embodiment, while the training control signal CKECAL is enabled, the input/output control signal generating circuit 41 may generate the first input control signal WR<1> which is enabled when the input control code WR_CD has a logic low level (or a logic high level depending on the embodiment). Also, the input/output control signal generating circuit 41 may generate the second input control signal WR<2> which is enabled when the input control code WR_CD has a logic high level (or a logic low level depending on the embodiment).

In addition, while the training control signal CKECAL is enabled, the input/output control signal generating circuit 41 may generate the first output control signal OP<1> which is enabled when the output control code OP_CD has a logic low level (or a logic high level depending on the embodiment). Also, the input/output control signal generating circuit 41 may generate the second output control signal OP<2> which is enabled when the output control code OP_CD has a logic high level (or a logic low level depending on the embodiment). The logic levels of the first and second input control signals WR<1:2> and the first and second output control signals OP<1:2> which are enabled may be set to be any suitable levels or signals depending on the embodiment.

The first storage 42 may store first information included in the set code SCD for setting the level of the reference voltage VREF_CA at the first set frequency of the external clock signal CLK if the first input control signal WR<1> is enabled. The first storage 42 may output the first information stored therein as a first storage signal SD1 if the first output control signal OP<1> is enabled. The second storage 43 may store second information included in the set code SCD for setting the level of the reference voltage VREF_CA at the second set frequency of the external clock signal CLK if the second input control signal WR<2> is enabled. The second storage 43 may output the second information stored therein as a second storage signal SD2 if the second output control signal OP<2> is enabled. The latch 44 may latch the first storage signal SD1 or the second storage signal SD2 to output the latched signal as the reference voltage VREF_CA.

Hereinafter, an operation of the reference voltage generating circuit 27 will be described with reference to FIG. 5. If both of the input control code WR_CD and the output control code OP_CD have a logic low level, the first input control signals WR<1> may be enabled to have a logic high level. The first information of the set code SCD for setting the level the reference voltage VREF_CA at the first set frequency of the external clock signal CLK may be stored in the first storage 42.

If the input control code WR_CD has a logic low level and the output control code OP_CD has a logic high level, the first output control signals OP<1> may be enabled to have a logic high level. The level of the reference voltage VREF_CA may be set according to the first information stored in the first storage 42.

If the input control code WR_CD has a logic high level and the output control code OP_CD has a logic low level, the second input control signal WR<2> may be enabled to have a logic high level. The second information of the set code SCD for setting the level the reference voltage VREF_CA at the second set frequency of the external clock signal CLK may be stored in the second storage 43.

If both of the input control code WR_CD and the output control code OP_CD have a logic high level, the second output control signal OP<2> may be enabled to have a logic high level and the level of the reference voltage VREF_CA may be set according to the second information stored in the second storage 43.

As described above in relation to FIG. 5, the reference voltage generating circuit 27 may sequentially set the levels of the reference voltage VREF_CA for frequencies of the external clock signal CLK according to a logic level combination of the input control code WR_CD and the output control code OP_CD.

Figure 6:
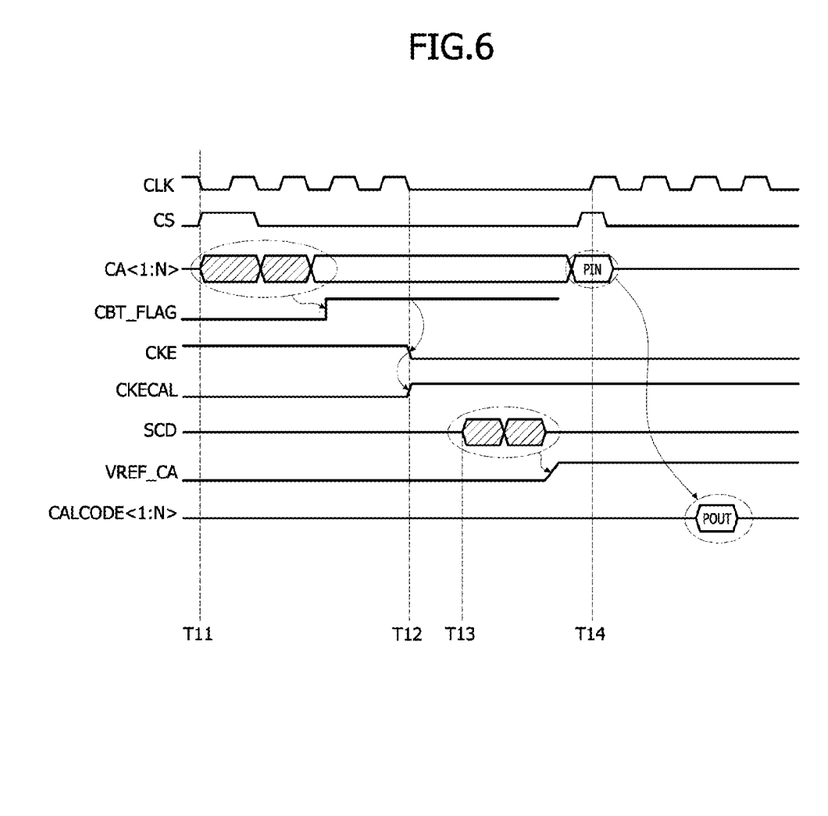
FIG. 6 is a timing diagram illustrating an example of a training operation of the semiconductor system shown in FIG. 1.

A training operation of the semiconductor system having the aforementioned configuration will be described hereinafter with reference to FIG. 6.

At a point of time T11, the flag signal CBT_FLAG which is enabled to a logic high level by the external signals CA<1:N> in synchronization with the external clock signal CLK and the chip selection signal CS may be generated. Since an operation about generation of the flag signal CBT_FLAG is described in detail with reference to FIG. 1, a detailed description thereof will be omitted hereinafter.

At a point of time T12, if a level of the clock enablement signal CKE changes from a logic high level to a logic low level while the flag signal CBT_FLAG has a logic high level, the training control signal CKECAL may be enabled to a logic high level.

At a point of time T13, the set code SCD may be inputted to the reference voltage generating circuit 27 according to the training control signal CKECAL which is enabled to a logic high level, and the level of the reference voltage VREF_CA may be adjusted according to the logic level of the set code SCD. At this time, a level of the reference voltage VREF_CA when the external clock signal CLK has the first set frequency may be set to be different from a level of the reference voltage VREF_CA when the external clock signal CLK has the second set frequency. That is, the level of the reference voltage VREF_CA may be adjusted according to a frequency of the external clock signal CLK.

The operation of setting the levels of the reference voltage VREF_CA at the first set frequency and the second frequency of the external clock signal CLK is described in detail with reference to FIG. 4 and FIG. 5. Thus, a detailed description thereof will be omitted hereinafter.

At a point of time T14, the external signals CA<1:N> including pattern data PIN may be inputted to the semiconductor device 2 when the chip selection signal CS is inputted to the semiconductor device 2 in synchronization with a rising edge of the external clock signal CLK. The external signals CA<1:N> may be buffered by the reference voltage VREF_CA whose level is set in advance, and the buffered external signals CA<1:N> may be outputted as the calibration codes CALCODE<1:N>.

The controller 1 may repeatedly perform an operation of comparing pattern data POUT of the calibration codes CALCODE<1:N> with the pattern data PIN of the external signals CA<1:N>, thereby confirming a valid window of the chip selection signal CS and a valid window of the external signals CA<1:N> and storing information on the valid windows therein.

The valid window of the chip selection signal CS may be obtained by confirming a time period that the pattern data POUT of the calibration codes CALCODE<1:N> and the pattern data PIN of the external signals CA<1:N> are inputted together while pulse generation timing of the chip selection signal CS inputted in synchronization with a rising edge of the external clock signal CLK is sequentially changed in a predetermined time period. The confirmation of the valid window of the chip selection signal CS may be sequentially made while the level of the reference voltage VREF_CA is adjusted according to a frequency of the external clock signal CLK.

Meanwhile, the valid window of the external signals CA<1:N> may be obtained by confirming a time period that the pattern data POUT of the calibration codes CALCODE<1:N> and the pattern data PIN of the external signals CA<1:N> are inputted together while input timing of the external signals CA<1:N> inputted in synchronization with the chip selection signal CS is sequentially changed in a predetermined time period. The confirmation of the valid window of the external signals CA<1:N> may be sequentially made while the level of the reference voltage VREF_CA is adjusted according to a frequency of the external clock signal CLK.

Figure 7:
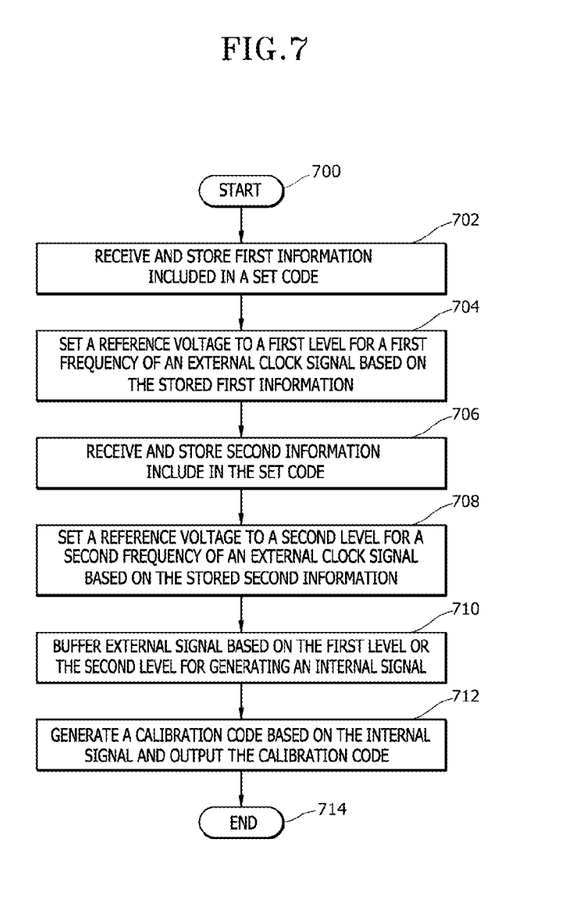
FIG. 7 is a flowchart of a method for use in operating a semiconductor device or system based on operation mode information.

A method for use in operating a semiconductor device or system is now described in relation to the flowchart of FIG. 7. The method may utilize the circuitry described above in relation to FIGS. 1-6.

Beginning at a start block 700 of FIG. 7, first information included in a set code is received and stored (step 702 of FIG. 7). The reference voltage is set to a first level for a first frequency of an external clock signal based on the stored first information (step 704 of FIG. 7). Second information included in the set code may be received and stored (step 706 of FIG. 7). The reference voltage may be set to a second level for a second frequency of the external clock signal based on the stored second information (step 708 of FIG. 7).

An external signal is buffered based on the first level or the second level of the reference voltage for generating an internal signal (step 710 of FIG. 7). The internal signal may be generated by setting the internal signal to a first logic level if a level of the external signal is higher than the first level of the reference voltage, and setting the internal signal to a second logic level if the level of the external signal is lower than the first level of the reference voltage.

A calibration code is generated based on the internal signal, and outputting the calibration code (step 712 of FIG. 7). The flowchart ends at an end block 714 of FIG. 7, but the method may be repeated as necessary.

The semiconductor devices described above may be provided in various electronic devices.

Figure 8:
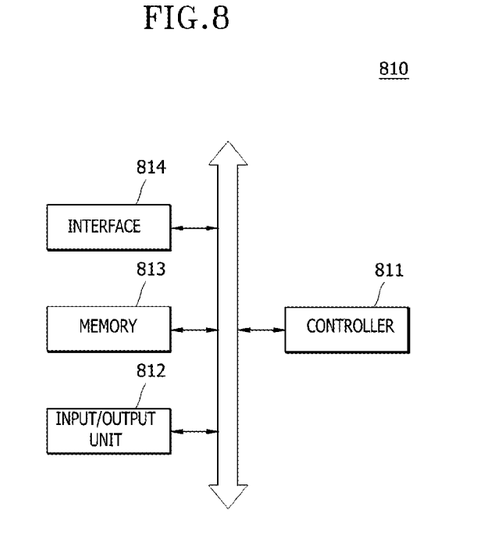
FIG. 8 is a block diagram illustrating a representation of an example of an electronic device which includes a semiconductor device configured in accordance with an embodiment.

Referring to FIG. 8, a semiconductor device in accordance with an embodiment may be provided in an electronic device 810. The electronic device 810 may include a controller 811, an input/output device 812, and a memory 813. The controller 811, the input/output device 812 and the memory 813 may be coupled with one another through a bus 815 providing a path through which data are transmitted.

For example but not limited to, the controller 811 may include at least any one of at least one microprocessor, at least one digital signal processor, at least one microcontroller, and logic devices capable of performing the same functions as these components. At least one of the controller 811 and the memory 813 may include at least any one of the semiconductor devices according to the embodiments of the present disclosure. The input/output device 812 may include at least one selected among a keypad, a keyboard, a display device, a touch screen and so forth. The memory 813 is a device for storing data. The memory 813 may store data and/or commands to be executed by the controller 811, and the likes.

The memory 813 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic device 810 may stably store a large amount of data in a flash memory system.

The electronic device 810 may further include an interface 814 configured to transmit and receive data to and from a communication network. The interface 814 may be a wired or wireless type. For example, the interface 814 may include an antenna or a wired or wireless transceiver.

The electronic device 810 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment, electronic device 810 is configured to perform wireless communication. In such a case, the electronic device 710 may be used in a communication system such as, but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 9:
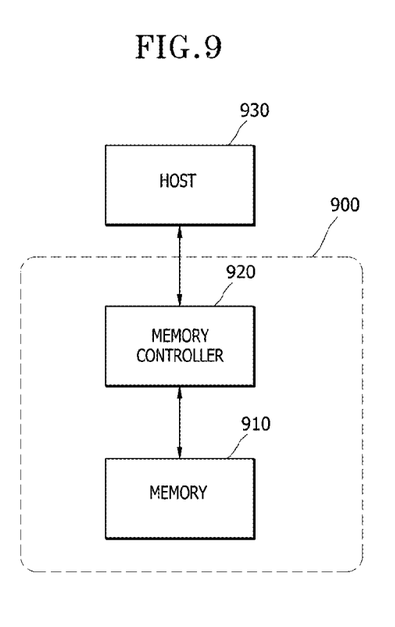
FIG. 9 is a block diagram illustrating a representation of an example of a memory card which includes a semiconductor device configured in accordance with an embodiment.

Referring to FIG. 9, a semiconductor device in accordance with an embodiment may be provided in the form of a memory card 900. For example, the memory card 900 may include a memory 910 such as a nonvolatile memory device and a memory controller 920. The memory 910 and the memory controller 920 may store data or read stored data.

The memory controller 920 may control the memory 910 such that stored data is read out or data is stored based on a read/write request from a host 930.

According to the present disclosure, operation mode information may be stored for each frequency of an external clock signal, and the stored operation mode information may be used to execute various operations.

In addition, according to the present disclosure, a training operation for adjusting the level of the reference voltage for each frequency of the external clock signal is provided, using the operation mode information stored for each frequency of the external clock signal.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

The invention claimed is:

1. A semiconductor device comprising:
   a flag signal generating circuit to generate a flag signal based on an internal command and a training control code which are extracted from an external signal;
   a reference voltage generating circuit to receive a set code based on the flag signal, an input control code and an output control code, and to generate a reference voltage having a level that is set based on the set code; and
   a buffer to buffer the external signal based on the reference voltage for generating an internal signal, and to generate a calibration code from the internal signal based on the flag signal for outputting the calibration code.

2. The device of claim 1, wherein the flag signal generating circuit generates the flag signal based on the internal command and the training control code which are extracted from the external signal which includes at least one of a command and an address.

3. The device of claim 1, wherein the set code is inputted as a first data signal and the calibration code is outputted as a second data signal.

4. The device of claim 1, wherein the buffer comprises a first buffer, the device further comprising:
   a second buffer to buffer an external clock signal and a chip selection signal for generating an internal clock signal and an internal chip selection signal.

5. The device of claim 4, wherein the first buffer includes:
   a first latch to latch the internal chip selection signal based on the flag signal for generating an internal latch signal; and
   a second latch to generate the calibration code from the internal signal based on the internal latch signal.

6. The device of claim 5, wherein the second latch includes:
   a transmitter to transmit the internal signal based on the internal latch signal; and
   an initialization circuit to initialize an output node of the transmitter based on a power-up signal.

7. The device of claim 1, further comprising:
   a training control signal generating circuit to generate a training control signal based on the flag signal and a clock enablement signal.

8. The device of claim 1, wherein the reference voltage generating circuit receives information included in the set code for each frequency of an external clock signal based on the input control code and the output control code while the flag signal is enabled, and to set a level of the reference voltage from the information included in the set code which is inputted for each frequency of the external clock signal.

9. The device of claim 8, wherein the reference voltage generating circuit receives and stores first information included in the set code for setting the reference voltage at a first set frequency of the external clock signal, the reference voltage to a first level using the stored first information, receives and stores second information included in the set code for setting the reference voltage at a second set frequency of the external clock signal, and set the reference voltage to a second level using the stored second information.

10. The device of claim 1, wherein the reference voltage generating circuit includes:
an input/output control signal generating circuit to generate a first input control signal, a second input control signal, a first output control signal and a second output control signal based on the input control code and the output control code, while the flag signal is enabled;
a first storage to store first information included in the set code for setting the reference voltage at a first set frequency of an external clock signal based on the first input control signal and the first output control signal, and to output the stored first information as a first storage signal for setting the level of the reference voltage; and
a second storage to store second information included in the set code for setting the reference voltage at a second set frequency of the external clock signal based on the second input control signal and the second output control signal, and to output the stored second information as a second storage signal for setting the level of the reference voltage.

11. The device of claim 10,
wherein the first input control signal is enabled if a combination of the input control code and the output control code is a first logic level combination;
wherein the first output control signal is enabled if the combination of the input control code and the output control code is a second logic level combination;
wherein the second input control signal is enabled if the combination of the input control code and the output control code is a third logic level combination; and
wherein the second output control signal is enabled if the combination of the input control code and the output control code is a fourth logic level combination.

12. The device of claim 10, wherein the first storage stores the first information if the first input control signal is enabled, and outputs the stored first information as the first storage signal if the first output control signal is enabled.

13. A semiconductor device comprising:
an input/output control signal generating circuit to generate a first input control signal, a second input control signal, a first output control signal and a second output control signal based on an input control code and an output control code, while a flag signal is enabled;
a first storage to store first information included in a set code for setting a reference voltage at a first set frequency of an external clock signal based on the first input control signal and the first output control signal, and to output the stored first information as a first storage signal for setting operation mode information; and
a second storage to store second information included in the set code for setting the reference voltage at a second set frequency of the external clock signal based on the second input control signal and the second output control signal, and to output the stored second information as a second storage signal for setting the operation mode information.

14. The device of claim 13, further comprising:
a flag signal generating circuit to generate the flag signal based on an internal command and a training control code which are extracted from an external signal.

15. The device of claim 13,
wherein the first input control signal is enabled if a combination of the input control code and the output control code is a first logic level combination;
wherein the first output control signal is enabled if the combination of the input control code and the output control code is a second logic level combination;
wherein the second input control signal is enabled if the combination of the input control code and the output control code is a third logic level combination; and
wherein the second output control signal is enabled if the combination of the input control code and the output control code is a fourth logic level combination.

16. The device of claim 13, wherein the first storage stores the first information if the first input control signal is enabled, and outputs the stored first information as the first storage signal if the first output control signal is enabled.

17. The device of claim 13, wherein the operation mode information includes at least one of burst type information, burst length information, write latency information, read latency information, preamble information, postamble information, driver strength information, data bus inversion (DBI) information and on-die termination (ODT) information.

18. A semiconductor system comprising:
a controller to output an external signal and a first data signal, and to receive a second data signal; and
a semiconductor device to generate a flag signal based on the external signal, to receive the first data signal as a set code based on the flag signal, an input control code and an output control code for setting a level of a reference voltage for each frequency of an external clock signal, to buffer the external signal based on the reference voltage for generating an internal signal, and to generate a calibration code from the internal signal based on the flag signal to output the calibration code as the second data signal.

19. The system of claim 18, wherein the semiconductor device includes:
a flag signal generating circuit to generate the flag signal based on an internal command and a training control code which are extracted from the external signal; and
a first buffer to buffer the external signal based on the reference voltage for generating the internal signal, and to generate the calibration code from the internal signal based on the flag signal to output the calibration code.

20. The system of claim 18, wherein the semiconductor device includes:
a reference voltage generating circuit to receive information included in the set code for each frequency of the external clock signal based on the input control code and the output control code while the flag signal is enabled, and to set the level of the reference voltage from the information included in the set code which is inputted for each frequency of the external clock signal.

21. The system of claim 20, wherein the reference voltage generating circuit receives and stores first information included in the set code for setting the reference voltage at a first set frequency of the external clock signal, sets the level of the reference voltage using the stored first information, receives and stores second information included in the set code for setting the reference voltage at a second set frequency of the external clock signal, and sets the level of the reference voltage using the stored second information.

22. The system of claim 20, wherein the reference voltage generating circuit includes:
an input/output control signal generating circuit to generate a first input control signal, a second input control signal, a first output control signal and a second output control signal based on the input control code and the output control code, while the flag signal is enabled;
a first storage to store first information included in the set code for setting the reference voltage at a first set frequency of the external clock signal based on the first input control signal and the first output control signal, and to output the stored first information as a first storage signal for setting the level of the reference voltage; and
a second storage to store second information included in the set code for setting the reference voltage at a second set frequency of the external clock signal based on the second input control signal and the second output control signal, and to output the stored second information as a second storage signal for setting the level of the reference voltage.

23. The system of claim 22,
wherein the first input control signal is enabled if a combination of the input control code and the output control code is a first logic level combination;
wherein the first output control signal is enabled if the combination of the input control code and the output control code is a second logic level combination;
wherein the second input control signal is enabled if the combination of the input control code and the output control code is a third logic level combination; and
wherein the second output control signal is enabled if the combination of the input control code and the output control code is a fourth logic level combination.

24. The system of claim 22, wherein the first storage device stores the set code if the first input control signal is enabled and outputs the stored set code as the first storage signal if the first output control signal is enabled.

25. A method for use in operating a semiconductor device or system, the method comprising:
receiving and storing first information included in a set code;
setting the reference voltage to a first level for a first frequency of an external clock signal based on the stored first information;
receiving and storing second information included in the set code; and
setting the reference voltage to a second level for a second frequency of the external clock signal based on the stored second information.

26. The method of claim 25, further comprising:
buffering an external signal based on the first level or the second level of the reference voltage for generating an internal signal; and
generating a calibration code based on the internal signal, and outputting the calibration code.

27. The method of claim 26, wherein generating the internal signal comprises:
setting the internal signal to a first logic level if a level of the external signal is higher than the first level of the reference voltage; and
setting the internal signal to a second logic level if the level of the external signal is lower than the first level of the reference voltage.

28. An electronic device, comprising:
a controller;
a memory coupled to the controller;
an input/output device coupled to the controller;
at least one of the controller and the memory including a semiconductor device which comprises:
a flag signal generating circuit to generate a flag signal based on an internal command and a training control code which are extracted from an external signal;
a reference voltage generating circuit to receive a set code based on the flag signal, an input control code and an output control code, and to generate a reference voltage whose level is set based on the set code; and
a first buffer to buffer the external signal based on the reference voltage for generating an internal signal, and to generate a calibration code from the internal signal based on the flag signal for outputting the calibration code.

29. The electronic device of claim 25, comprising one of a personal computer, a laptop computer, a tablet, a personal digital assistant (PDA), a mobile phone, a smart phone, and a wireless phone.

30. A memory card, comprising:
a memory;
a memory controller coupled to the memory;
the memory including a memory device which comprises:
a flag signal generating circuit to generate a flag signal based on an internal command and a training control code which are extracted from an external signal;
a reference voltage generating circuit to receive a set code based on the flag signal, an input control code and an output control code, and to generate a reference voltage whose level is set based on the set code; and
a first buffer to buffer the external signal based on the reference voltage for generating an internal signal, and to generate a calibration code from the internal signal based on the flag signal for outputting the calibration code.

* * * * *